(12) United States Patent
Rigby et al.

(10) Patent No.: US 6,205,700 B1
(45) Date of Patent: Mar. 27, 2001

(54) MODULE FOR ELECTRICALLY CONNECTING A DAUGHTER CARD TO A BACK PLANE

(75) Inventors: William J. Rigby, Somis; Scott S. Blaise, Camarillo, both of CA (US)

(73) Assignee: Component Equipment Company, Inc., Camarillo, CA (US)

( * ) Notice: Subject to any disclaimer, the term of this patent is extended or adjusted under 35 U.S.C. 154(b) by 0 days.

(21) Appl. No.: 09/467,794

(22) Filed: Dec. 20, 1999

(51) Int. Cl.⁷ .................................................. H01R 9/09
(52) U.S. Cl. ........................................................ 43/79
(58) Field of Search ............................. 439/79, 378, 630, 439/608, 101, 78

(56) References Cited

U.S. PATENT DOCUMENTS 3,864,000 * 2/1975 Coller et al. ..................... 339/64 M
4,571,014 * 2/1986 Robin et al. ....................... 339/14 R
5,445,527 * 8/1995 Martin ................................. 439/78

* cited by examiner

*Primary Examiner*—Gary F. Paumen
*Assistant Examiner*—Phuongchi Nguyen
(74) *Attorney, Agent, or Firm*—Jack C. Munro

(57) ABSTRACT

An electrical connector for connecting a daughter card to a back plane. The back plane has a male electrical connector which has a grouping of a plurality of parallel protruding electrical connecting pins. Mounted on these pins is a daughter card alignment module with this module having an internal cavity. One end of the internal cavity terminates in a guide post. A female electrical connector that is mounted at an edge of a daughter card is to be matingly located within the internal cavity with the edge of the daughter card to slidingly connect with slots formed within the module. The guide post is to connect with a recess formed in the daughter card.

7 Claims, 2 Drawing Sheets

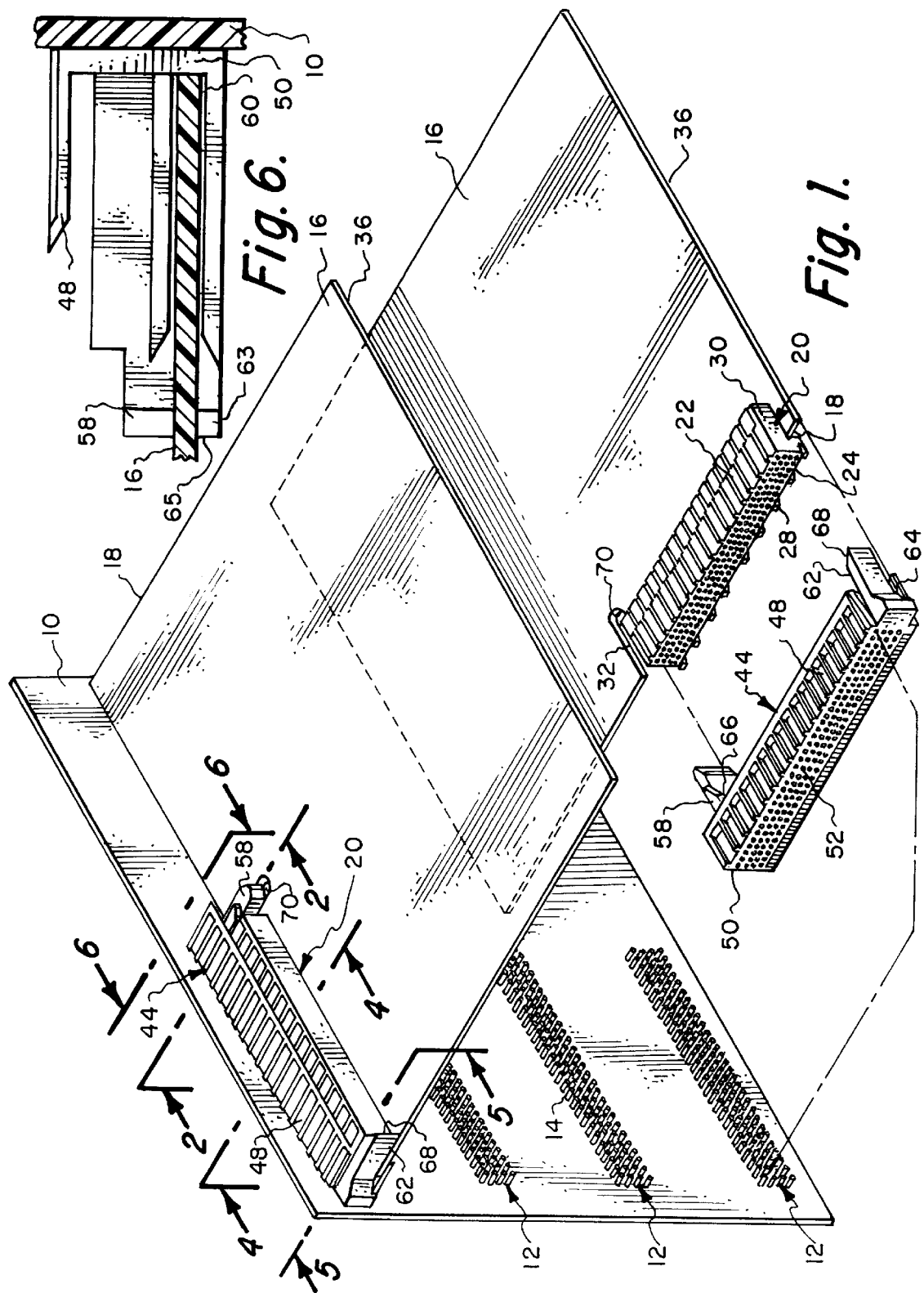

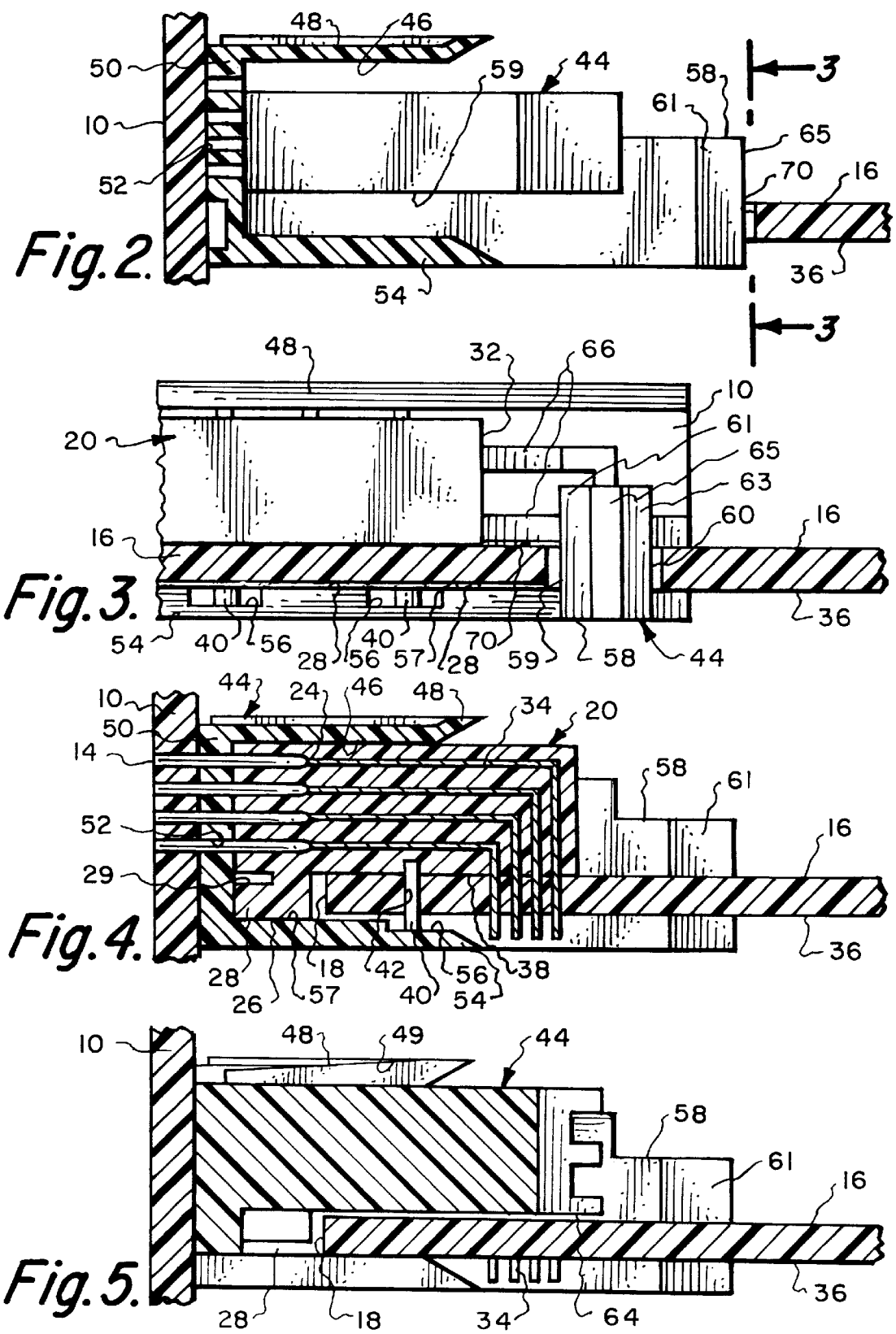

MODULE FOR ELECTRICALLY CONNECTING A DAUGHTER CARD TO A BACK PLANE

BACKGROUND OF THE INVENTION

1) Field of the Invention

The field of this invention relates to electrical connectors and more particularly to an electrical connector between a daughter card circuit board and a back plane printed circuit board.

2) Description of the Prior Art

In the assembling of electronic computing equipment, it is exceedingly common to utilize a printed circuit board known as a back plane. Mounted on the back plane are a plurality of metallic male electrical connectors with each male electrical connector having a grouping of a plurality of parallel protruding electrical connecting pins. Each male electrical connector is to plug into a female electrical connector which is mounted on a daughter card. When the female electrical connector connects with the male electrical connector, the daughter card assumes a substantially perpendicular position relative to the back plane. It is to be understood that there is a separate daughter card connected to each male electrical connector.

These male electrical connector pins are quite thin in cross-section and are generally no more than a half to threequarters of an inch in length. These pins can be relatively easily bent. Each pin is to connect with a separate pin receiving hole formed in the female electrical connector of the daughter card. If a bent pin does not engage with its proper hole, not only will the computer equipment not function properly but also may be subject to encountering an electrical short which can destroy both the daughter card and back plane and may even start a fire.

In the past, daughter cards and back planes have been constructed in a manner to try to facilitate only the correct connection between the female electrical connector and the male electrical connector. This construction has been to mount a guide post on the back plane directly adjacent the male electrical connector. Mounted in conjunction with the male electrical connector is a module with this module having an internal cavity within which is to be mounted in a matingly connected manner the female electrical connector of the daughter card. The daughter card also includes a slot with this slot to receive the guide post. Therefore, it is the intention, when the guide post is aligned with the slot, to have the female electrical connector be aligned with the internal cavity of the module with precise alignment to be achieved between the female electrical connector and the male electrical connector as connection occurs. However, it has been discovered misalignments can occur which can result in one or more of bent pins of the male electrical connector. It would be desirable to construct a connecting arrangement between the male electrical connector and the female electrical connector that insures that only the precise connection can result between the female electrical connector and the male electrical connector.

SUMMARY OF THE INVENTION

A back plane has a male electrical connector which comprises a grouping of a plurality of parallel protruding electrical connecting pins. A daughter card has mounted at its edge a female electrical connector with this female electrical connector having a separate receiving hole for each pin. A daughter card alignment module, which has a channel shape, has a separate hole for each male pin. This module is to be mounted on the male connector and is snugly retained thereby. This module, at one end, is closed by a guide post at one end and at the opposite end is closed by an end wall thereby completely enclosing the internal cavity of the module. Associated with both the guide post and end wall is a slot with each of these slots to only connect with the edge of the daughter board. When the edge of the daughter board is so connected with the slots, it is known to the installer that the precise interconnecting arrangement between the daughter board and the back plane is now established. The guide post also connects with a recess formed in the daughter board further insuring the precise alignment between the daughter board and the back plane. Both the guide post and end wall include slanted deflecting surfaces that direct the female electrical connector into the precise position within the internal cavity of the module during insertion of the female electrical connector within the internal cavity. Therefore, by the time each of the holes of the female electrical connector begin to engage with the pins, each pin is precisely aligned with its respective hole thereby eliminating the possibility of any misalignment and the producing of any bent pins.

The primary objective of the present invention is to construct an electrical connector between a daughter card and a back plane which directly longitudinally and transversely positions the female electrical connector of the daughter card with the male electrical connector of the back plane.

Another objective of the present invention is to construct a daughter card alignment module which includes deflecting surfaces at each longitudinal end of the module that function to initially direct the female electrical connector into the correct mating position with the internal cavity of the module prior to engagement of the male pins of the back plane electrical connector with the female electrical connector.

Another objective of the present invention is to construct a daughter card alignment module which integrates with a guide post which was separate in the prior art to establish the initial connecting arrangement between the daughter card and the back plane. This integration of the guide post eliminates the attachment of a separate part to the back plane thereby reducing cost of assembly of the back plane thereby increasing productivity with improved quality.

BRIEF DESCRIPTION OF THE DRAWINGS

FIG. 1 is an isometric view showing a view of a daughter card connected with a back plane and also a view of a daughter card separated from a back plane which incorporates the daughter card alignment module with the present invention;

FIG. 2 is a transverse cross-sectional view through a guide post that is included within the daughter card alignment module of this invention showing the guide post connecting with the recess formed in the daughter card taken along line 2—2 of FIG. 1;

FIG. 3 is a longitudinal cross-sectional view taken along line 3—3 of FIG. 2;

FIG. 4 is a transverse cross-sectional view through the center portion of the daughter card alignment module taken along line 4—4 of FIG. 1;

FIG. 5 is a transverse cross-sectional view taken through the closed end of the daughter card alignment module that is opposite the guide post taken along line 5—5 of FIG. 1; and FIG. 6 is an end view of the guide post taken along line 6—6 of FIG. 1.

DETAILED DESCRIPTION OF THE PREFERRED EMBODIMENT

Referring particularly to the drawings, there is shown a main printed circuit board which is to be referred to as a back plane 10 which includes electrical circuitry, which is not shown. Connection to the electrical circuitry is provided by means of a series of male electrical connectors 12. Each male electrical connector 12 has a rectangular array of parallel protruding pins 14. It is to be understood that there is to be a daughter card 16 connected with each of the male electrical connectors 12. Therefore, for the back plane 10 that is shown in FIG. 1, there is to be connected four in number of daughter cards 16. Both the back plane 10 and daughter card 16 generally take the shape of a rectangular or square shaped section of sheet material.

The daughter card 16 has a peripheral edge 18. Mounted on each daughter card 16 is a female electrical connector 20. The female electrical connector 20 basically takes the form of a solid block which has an upper surface which has formed thereon a series of strengthening ridges 22. The forward end of the female electrical connector 20 includes a mass of receiving holes 24. There is to be a receiving hole 24 for each pin 14. The female electrical connector 20 has a bottom 26 which has mounted thereon a plurality of evenly spaced apart protrusions 28. A gap 29 separates each protrusion from the female electrical connector 20. The female electrical connector 20 has a right side 30 and a left side 32.

Internally located within each hole 24 is an L-shaped electrical connecting member 34. The L-shaped connecting members 34 protrude from the bottom 36 of the daughter card 16. These L-shaped electrical connecting members 34 are to connect with the circuit which is formed within the daughter card 16. The members 34 are each conducted through an appropriate hole formed through the daughter card 16. Fixedly mounted to the recessed bottom surface 38 of the female electrical connector 20 are a series of posts 40. The posts 40 are constructed of electrically insulative material such as plastic. Each post 40 is intended to be passed through a hole 42 formed within the daughter card 16. The posts 40, in conjunction with the holes 42, function to securely mount the female electrical connector 20 onto the daughter card 16.

A daughter card alignment module 44 is constructed of an electrically insulative material such as plastic and has a basically channel shaped main body defining an elongated internal cavity 46. The module 44 has a top 48 which internally has a series of evenly spaced apart receiving slots 49. The female electrical connector 20 is to be located within the internal cavity 46 with each ridge 22 to engage with one of those receiving slots 49. This helps to align the female electrical connector 20 in a precise position relative to the module 44.

The module 44 has a base 50 which includes a mass of evenly spaced apart holes 52. There is to be a hole 52 for each pin 14 and it is intended that when each pin 14 is engaged with a hole 52 and the base 50 is located directly against the back plane so the daughter card alignment module 44 is snugly retained in position. The module 44 has a bottom 54 which includes a series of spaced apart recesses 56. There is a flat section 57 located between each directly adjacent pair of recesses 56. Each protrusion 28 is to slide onto and rest against a flat section 57. Within each recess 56 is to be located one of the posts 40. Again, the cooperation of the post 40 with the recesses 56 assist in correctly aligning the daughter card alignment module 44 with the female electrical connector 20.

The module 44 has a left end to which is integrally attached thereto a guide post 58. The guide post 58 protrudes exteriorly from the main body of the module 44. The outer surface of the guide post 58 includes a slot 60. The inner surface of the guide post 58 includes a slot 59. Guide post 58 has a sharpened configuration formed by slanted surfaces 61 and 63 located on opposite sides of flat tip 65.

At the opposite end of the module 44 there is located an end wall 62. Located directly adjacent the end wall 62 is a slot 64. Peripheral edge 18 of the daughter card 16 is to engage with the slots 59, 60 and 64. These slots 59, 60 and 64 precisely align the position of the female electrical connector 20 relative to the module 44 to insure that each receiver hole 24 is correctly positioned with its respective pin 14.

It is to be noted that the end wall 62 also protrudes from the main body portion of the module 44. However, the function of the end wall 62 is to merely to close off the right side of the module 44 so that the only entrance into the internal cavity 46 is through the open front into which is to be slid the female electrical connector 20. It is to be noted that the inside surface of the guide post 58 includes a slanted deflecting surface 66 with a similar deflecting surface 68 being formed on the inside surface of the end wall 62. It is the function of the deflecting surfaces 66 and 68 that when initial connection between the female electrical connector 20 is established with the module 44 that the deflecting surfaces 66 and 68 direct the female electrical connector 20 in only a precise direction relative to the module 44 as the female electrical connector 20 is inserted within the internal cavity 46. The guide post 58 is to be mounted within a recess 70 formed within the daughter board 16. Recess 70 is open at the peripheral edge 18. This engagement of the guide post 58 with the recess 70 is established initially at the beginning of the engagement between the female electrical connector 20 and the module 44 which establishes the intial correct position between the module 44 and the female electrical connector 20. It is the function of the end wall 62 to merely close off the right side of the module 48.

What is claimed is:

1. An electrical connector assembly for connecting a daughter card to a back plane comprising:

a back plane having a male electrical connector which has a grouping of a plurality of parallel protruding electrically connecting pins;

a daughter card aligning module mounted on said pins, said module having a main body which has an internal cavity which terminates at one end by a guide post and at an opposite end by an end wall, both said guide post and said end wall protrude outward from said main body;

a daughter card having a peripheral edge, a female electrical connector mounted on said daughter card and located directly adjacent said peripheral edge, said female electrical connector to be located within said internal cavity between said guide post and said end wall; and slot means formed within said module, said peripheral edge of said daughter card to engage with said slot means thereby correctly aligning said female electrical connector with said module.

2. An electrical connector assembly for connecting a daughter card to a back plane comprising:

a back plane having a male electrical connector which has a grouping of a plurality of parallel protruding electrical connecting pins;

a daughter card aligning module mounted on said pins, said module having a main body which has an internal cavity which terminates at one end by a guide post, said guide post protruding outward from said main body;

a daughter card having a peripheral edge, a female electrical connector mounted on said daughter card and located directly adjacent said peripheral edge, said female electrical connector to be located within said internal cavity and directly adjacent said guide post; and slot means formed within said module, said peripheral edge of said daughter card to engage with said slot means thereby correctly aligning said female electrical connector within said module.

3. An electrical connector assembly for connecting a daughter card to a back plane comprising:

a back plane having a male electrical connector which has a grouping of a plurality of parallel protruding electrically connecting pins;

a daughter card aligning module mounted on said pins, said module having a main body which has an internal cavity which terminates at one end by a guide post and at an opposite end by an end wall, both said guide post and said end wall protrude outward from said main body;

a daughter card having a peripheral edge, a female electrical connector mounted on said daughter card and located directly adjacent said peripheral edge, said female electrical connector to be located within said internal cavity between said guide post and said end wall; and said guide post engages with a recess formed in said daughter card.

4. The electrical connector assembly as defined in claim 1 wherein:

said slot means being formed alongside of said guide post and within said end wall.

5. An electrical connector assembly for connecting a daughter card to a back plane comprising:

a back plane having a male electrical connector which has a grouping of a plurality of parallel protruding electrical connecting pins;

a daughter card aligning module mounted on said pins, said module having a main body which has an internal cavity which terminates at one end by a guide post, said guide post protruding outward from said main body;

a daughter card having a peripheral edge, a female electrical connector mounted on said daughter card and located directly adjacent said peripheral edge, said female electrical connector to be located within said internal cavity and directly adjacent said guide post; and said daughter card having a recess, said recess being open at said peripheral edge, said guide post engages with said recess.

6. The electrical connector assembly as defined in claim 5 wherein:

said internal cavity having an opposite end which is opposite said guide post, said opposite end being closed by an end wall.

7. The electrical connector assembly as defined in claim 6 wherein:

said slot means being formed alongside of said guide post and within said end wall.

\* \* \* \* \*